(12) United States Patent
Otani et al.

(10) Patent No.: US 11,327,397 B2
(45) Date of Patent: May 10, 2022

(54) PATTERN FORMING METHOD, COATING MATERIAL FOR IMPRINT PRETREATMENT AND SUBSTRATE PRETREATMENT METHOD

(71) Applicant: CANON KABUSHIKI KAISHA, Tokyo (JP)

(72) Inventors: Tomonori Otani, Iruma (JP); Toshiki Ito, Kawasaki (JP); Niyaz Khusnatdinov, Round Rock, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 371 days.

(21) Appl. No.: 16/548,371

(22) Filed: Aug. 22, 2019

(65) Prior Publication Data

US 2019/0377260 A1 Dec. 12, 2019

Related U.S. Application Data

(63) Continuation of application No. PCT/JP2018/008153, filed on Mar. 2, 2018.
(Continued)

(51) Int. Cl.
  *G03F 7/00* (2006.01)
  *B82Y 10/00* (2011.01)
  *B82Y 40/00* (2011.01)

(52) U.S. Cl.
  CPC ............ *G03F 7/0002* (2013.01); *B82Y 10/00* (2013.01); *B82Y 40/00* (2013.01)

(58) Field of Classification Search
  CPC ........ B82Y 10/00; B82Y 40/00; G03F 7/0002
  See application file for complete search history.

(56) References Cited

U.S. PATENT DOCUMENTS 7,157,036 B2   1/2007 Choi et al.
7,307,118 B2   12/2007 Xu et al.
(Continued)

FOREIGN PATENT DOCUMENTS

CN   101923282 A   12/2010
JP   2008-502157 A   1/2008
(Continued)

OTHER PUBLICATIONS

International Preliminary Report on Patentability in International Application No. PCT/JP2018/008153 (dated Sep. 19, 2019).
(Continued)

*Primary Examiner* — James Sanders
(74) *Attorney, Agent, or Firm* — Venable LLP

(57) ABSTRACT

A pattern forming method using a photo-nanoimprint process on each of a plurality of shot areas: a step (1) of laying a layer of a curable composition (A1); a step (2) of dispensing liquid droplets of a curable composition (A2) dropwise discretely onto the layer of (A1); a step (3) of sandwiching a layer obtained by partially mixing (A1) and (A2), between a mold and the substrate; a step (4) of irradiating the layer with light to cure the layer; and a step (5) of releasing the mold from the layer of (A1) and (A2), in which when steps from the step (3) to the step (5) are collectively called an imprinting step [Im], in a time period from an end of the step (2) to a beginning of the step [Im] in one shot, the step (2) or the step [Im] is performed on another shot area.

16 Claims, 3 Drawing Sheets

Related U.S. Application Data

(60) Provisional application No. 62/468,470, filed on Mar. 8, 2017.

(56) References Cited

U.S. PATENT DOCUMENTS

| | | |
|---|---|---|
| 7,837,921 B2 | 11/2010 | Xu et al. |
| 8,133,427 B2 | 3/2012 | Tada et al. |
| 8,142,703 B2 | 3/2012 | Xu et al. |
| 8,152,511 B2 | 4/2012 | Xu et al. |
| 8,202,468 B2 | 6/2012 | Zhu et al. |
| 8,206,639 B2 | 6/2012 | Zhu et al. |
| 8,268,220 B2 | 9/2012 | Xu et al. |
| 8,282,381 B1 | 10/2012 | Zhu et al. |
| 8,344,065 B2 | 1/2013 | Zhu et al. |
| 8,574,822 B2 | 11/2013 | Zhu et al. |
| 9,039,402 B2 | 5/2015 | Kawakami et al. |
| 9,120,265 B2 | 9/2015 | Zhu et al. |
| 9,796,803 B2 | 10/2017 | Kitagawa et al. |
| 10,150,231 B2 | 12/2018 | Ito et al. |
| RE47,456 E | 6/2019 | Kobayashi |
| 10,754,243 B2 | 8/2020 | Ito |
| 10,754,244 B2 | 8/2020 | Ito et al. |
| 10,754,245 B2 | 8/2020 | Ito et al. |
| 10,829,644 B2 | 11/2020 | Otani et al. |
| 10,845,700 B2 | 11/2020 | Chiba et al. |
| 10,883,006 B2 | 1/2021 | Chiba et al. |
| 10,935,884 B2 | 3/2021 | Chiba et al. |
| 11,037,785 B2 | 6/2021 | Kato et al. |
| 2005/0160934 A1 | 7/2005 | Xu et al. |
| 2006/0108710 A1 | 5/2006 | Xu et al. |
| 2006/0279024 A1 | 12/2006 | Choi et al. |
| 2007/0272825 A1 | 11/2007 | Xu et al. |
| 2009/0085255 A1 | 4/2009 | Tada et al. |
| 2010/0233377 A1 | 9/2010 | Aoki et al. |
| 2011/0215503 A1 | 9/2011 | Xu et al. |
| 2012/0076950 A1 | 3/2012 | Kodama |
| 2017/0283620 A1 | 10/2017 | Otani et al. |
| 2017/0283632 A1 | 10/2017 | Chiba et al. |
| 2017/0285462 A1 | 10/2017 | Ito |
| 2017/0285463 A1 | 10/2017 | Ito et al. |
| 2017/0285464 A1 | 10/2017 | Ito et al. |
| 2017/0285465 A1 | 10/2017 | Iimura et al. |
| 2017/0285466 A1 | 10/2017 | Chiba et al. |
| 2019/0004421 A1 | 1/2019 | Ito |
| 2019/0030785 A1 | 1/2019 | Kato et al. |
| 2019/0391483 A1 | 12/2019 | Ito et al. |
| 2019/0391484 A1 | 12/2019 | Chiba et al. |
| 2019/0393026 A1 | 12/2019 | Kato et al. |
| 2020/0166836 A1 | 5/2020 | Saito et al. |

FOREIGN PATENT DOCUMENTS

| | | |
|---|---|---|
| JP | 2009-083172 A | 4/2009 |
| JP | 2010-080632 A | 4/2010 |
| JP | 2010-239118 A | 10/2010 |
| JP | 4791357 B2 | 10/2011 |
| JP | 2011-231308 A | 11/2011 |
| JP | 2012-004515 A | 1/2012 |
| JP | 2014-024322 A | 2/2014 |
| JP | 2014-132669 A | 7/2014 |
| JP | 2016-134608 A | 7/2016 |
| KR | 10-2010-0035107 A | 4/2010 |
| KR | 10-2015-0013813 A | 2/2015 |
| WO | 2005/000552 A2 | 1/2005 |
| WO | 2005/120834 A2 | 12/2005 |
| WO | 2018/163995 A1 | 9/2018 |
| WO | 2018/164015 A1 | 9/2018 |
| WO | 2018/164016 A1 | 9/2018 |
| WO | 2018/164017 A1 | 9/2018 |

OTHER PUBLICATIONS

International Search Report in International Application No. PCT/JP2018/008153 (dated May 15, 2018).

Article 19 Amendment in International Application No. PCT/JP2018/008153 (dated Jul. 12, 2018).

Informal Comments in International Application No. PCT/JP2018/008153 (Jul. 12, 2018).

Shravanthi Reddy et al., "Simulation of Fluid Flow in the Step and Flash Imprint Lithography Process," 82 Microelectron. Eng. 60-70 (Jul. 2005).

Nobuyuki Imaishi, "Fundamental of the Marangoni Convection," Int. J. Microgravity Sci. No. 31 Supplement, pp. S5-S12 (2014).

Notification of Reason for Refusal in Korean Application No. 10-2019-7028626 (dated Jul. 2021).

Office Action in Taiwanese Application No. 107107614 (dated Nov. 2018).

Notice of Reasons for Refusal in Japanese Application No. 2019-504551 (dated Oct. 2021).

Chiba et al., U.S. Appl. No. 16/556,836, filed Aug. 30, 2019.

Ito et al., U.S. Appl. No. 16/552,815, filed Aug. 27, 2019.

Kato et al., U.S. Appl. No. 16/555,429, filed Aug. 29, 2019.

Notice of Reasons for Refusal in Japanese Application No. 2019-504550 (dated Sep. 2021).

Non-Final Office Action in U.S. Appl. No. 16/150,939 (dated Jun. 2021).

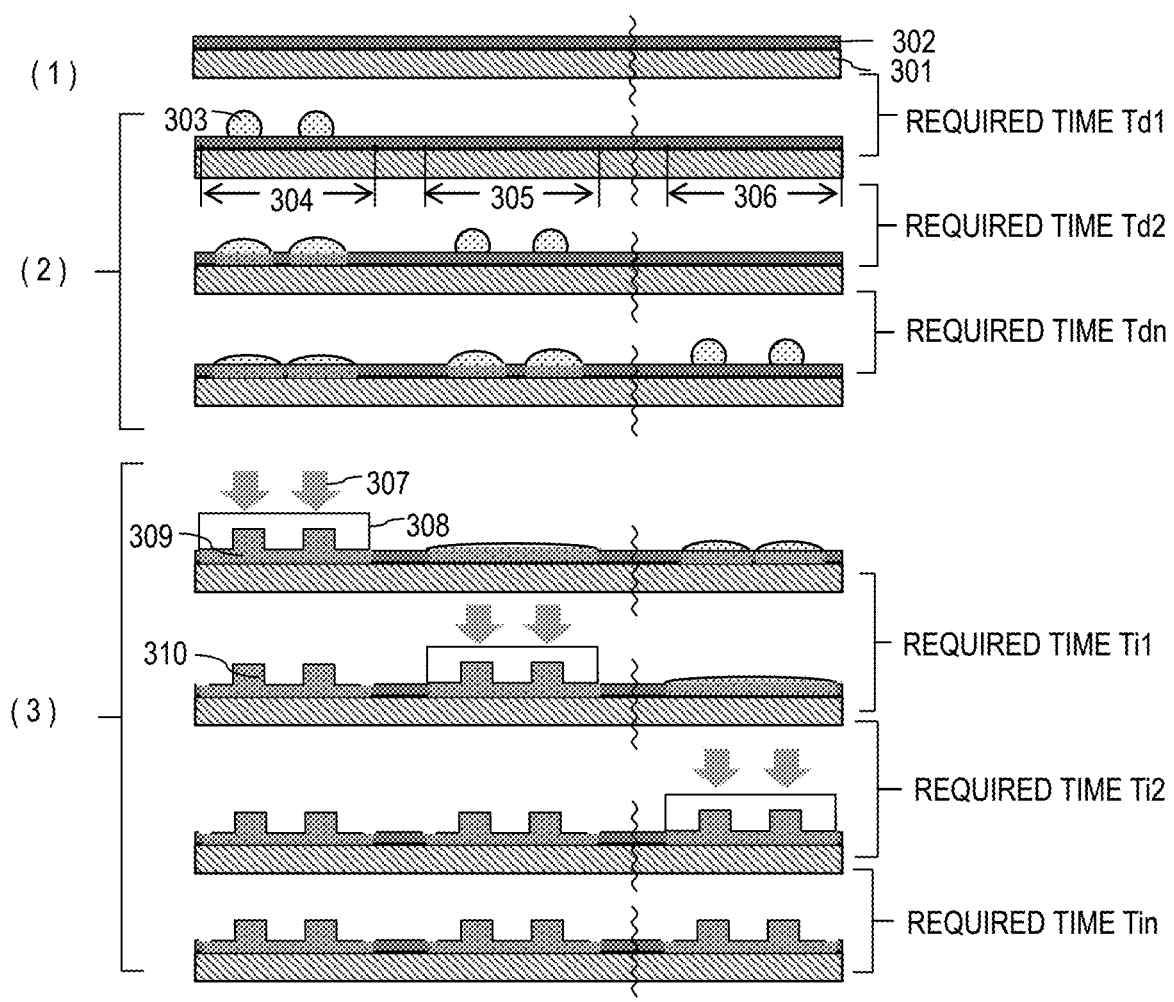

PATTERN FORMING METHOD, COATING MATERIAL FOR IMPRINT PRETREATMENT AND SUBSTRATE PRETREATMENT METHOD

CROSS-REFERENCE TO RELATED APPLICATIONS

This application is a Continuation of International Patent Application No. PCT/JP2018/008153, filed Mar. 2, 2018, which claims the benefit of U.S. Provisional Patent Application No. 62/468,470, filed Mar. 8, 2017, both of which are hereby incorporated by reference herein in their entirety.

BACKGROUND OF THE INVENTION

Field of the Invention

The present invention relates to a pattern forming method, a coating material for imprint pretreatment to be used in the method, and a substrate pretreatment method including using the material.

There has been a growing requirement for miniaturization in a semiconductor device, a MEMS, or the like, and hence a photo-nanoimprint technology has been attracting attention as a microfabrication technology. In the photo-nanoimprint technology, a photocurable composition (resist) is cured in a state in which a mold having a fine groove/land pattern formed on its surface is pressed against a substrate (wafer) having applied thereto the photocurable composition. Thus, the groove/land pattern of the mold is transferred onto the cured film of the photocurable composition and hence the pattern is formed on the substrate. According to the photo-nanoimprint technology, a fine structural body of the order of several nanometers can be formed on the substrate.

A method for forming pattern by a photo-nanoimprint technology disclosed in Japanese Patent No. 4791357 is described with reference to a schematic sectional view of FIG. 1. First, a liquid curable composition (resist) 102 is dispensed dropwise discretely onto a pattern forming area on a substrate 101 by using an inkjet method (arranging step, FIG. 1(1)). Liquid droplets of the curable composition 102 dispensed dropwise spread on the substrate 101 as indicated by arrows 104 each indicating the direction in which a liquid droplet spreads (FIG. 1(1)). The phenomenon is called prespread. Next, the curable composition 102 is molded with a mold 105 that has a pattern formed thereon and is transparent to irradiation light 106 to be described later (mold contacting step, FIG. 1(2)). In the mold contacting step, the liquid droplets of the curable composition 102 spread over the entire region of a gap between the substrate 101 and the mold 105 (FIG. 1(2)). The phenomenon is called spread. In addition, in the mold contacting step, the curable composition 102 is filled into a groove portion on the mold 105 as indicated by arrows 104 each indicating the direction in which a liquid droplet spreads by the capillary phenomenon (expanded part of FIG. 1(2)). The filling phenomenon is called fill. A time period required for the spread and the fill to be completed is called a filling time. After the completion of the filling of the curable composition 102 as indicated by arrows 104 each indicating the direction in which a liquid droplet spreads, the curable composition 102 is cured by being irradiated with the irradiation light 106 (light irradiating step, FIG. 1(3)), and then the substrate 101 is released from the mold 105 (releasing step, FIG. 1(4)).

The performance of those steps results in the formation of a cured film (photocured film 107) having a predetermined pattern on the substrate.

The photo-nanoimprint technology disclosed in Japanese Patent No. 4791357 has involved a problem in that a time period (filling time) from the initiation of the contact of the mold to the completion of the spread and the fill is long, and hence throughput is low.

In view of the foregoing, the inventors of the present invention have devised a photo-nanoimprint technology having a short filling time, in other words, high throughput (short spread time nanoimprint lithography, hereinafter referred to as "SST-NIL"). As illustrated in the schematic sectional views of FIG. 2, the SST-NIL is a technology obtaining a cured film 207 having pattern shapes that includes:

a laying step 1 (step (1)) of laying a liquid curable composition (A1) 202 on a substrate;

a laying step 2 (step (2)) of laying liquid droplets of a curable composition (A2) 203 discretely on the layer of the curable composition (A1) 202;

a mold contacting step (step (3)) of sandwiching a z obtained by partially mixing the curable composition (A1) 202 and the curable composition (A2) 203 between a mold 205 and the substrate 201;

a light irradiating step (step (4)) of irradiating the layer formed of the mixture 208 obtained by partially mixing the curable composition (A1) 202 and the curable composition (A2) 203 with irradiation light 206 from a side of the mold 205 to cure the layer in one stroke; and a releasing step (step (5)) of releasing the mold 205 from the layer formed of the curable compositions after the curing.

In the SST-NIL, a series of step units ranging from the step (2) to the step (5) is referred to as "shot", and an area where the mold 205 is in contact with the curable composition (A1) 202 and the curable composition (A2) 203, in other words, an area where a pattern is formed on the substrate is referred to as "shot area".

In the SST-NIL, the liquid droplets of the curable composition (A2) 203 dispensed dropwise discretely expand quickly on the liquid film of the curable composition (A1) 202, and hence a filling time is short and throughput is high. A detailed mechanism for the SST-NIL is described later.

However, the SST-NIL illustrated in FIG. 2 involves the following problem. That is, a curable composition (A1) 202 is laid on a substrate 201 by using, for example, spin coating so as to occupy an area wider than a shot area, such as the entire surface of the substrate. Meanwhile, a curable composition (A2) 203 is laid discretely by using, for example, an inkjet method. Here, the curable composition (A1) and the curable composition (A2) are different compositions, and after the curable composition (A2) has been dispensed dropwise, both the compositions are mixed by the time the light irradiating step begins. When the mixing of the curable composition (A1) 202 and the curable composition (A2) 203 is insufficient, the composition does not become uniform and hence the nonuniformity of film physical properties occurs. Accordingly, when the mixing is insufficient is irradiated with light to be cured, a problem in that the film physical properties of a film obtained by the curing, such as dry etching resistance, become nonuniform occurs.

The curable composition (A1) 202 and the curable composition (A2) 203 are mixed in a period from the laying step (step 2) to the beginning of the light irradiating step (step 4) to form the mixture 208 of the curable composition (A1) 202 and the curable composition (A2) 203. In general, there is often a difference in dry etching resistance between the curable composition (A1) 202 and the curable composition (A2) 203. For example, when the dry etching resistance of the curable composition (A1) 202 is lower than that of the curable composition (A2) 203, an area 209 where the mixing of the curable composition (A1) 202 and the curable composition (A2) 203 is not sufficient has low dry etching resistance. The area having low dry etching resistance serves as a defect at the time of etching in a subsequent step. In order to avoid such defect as described in the foregoing, the curable compositions need to be sufficiently mixed. In order to diffuse the curable composition (A2) 203 into the curable composition (A1) 202, the curable composition (A1) 202 and the curable composition (A2) 203 need to be brought into contact with each other for a long time period. However, when a long time period is taken for the mixing, a time period for one shot lengthens and hence a problem in that throughput remarkably reduces occurs.

In view of the foregoing, an object of the present invention is to provide a SST-NIL technology that provides high throughput and has uniform physical properties in a shot area of a substrate.

SUMMARY OF THE INVENTION

In order to solve the above-mentioned problem, according to one embodiment of the present invention, there is provided a pattern forming method using a photo-nanoimprint process, the method including performing, on each of a plurality of shot areas on a surface of a substrate, in this order:

a laying step (1) of laying a layer formed of a curable composition (A1) containing at least a component (a1) serving as a polymerizable compound;

a laying step (2) of dispensing liquid droplets of a curable composition (A2) containing at least a component (a2) serving as a polymerizable compound dropwise discretely onto the layer formed of the curable composition (A1) to lay the liquid droplets;

a mold contacting step (3) of sandwiching a layer obtained by partially mixing the curable composition (A1) and the curable composition (A2), the layer being formed by performing the laying step (2), between a mold and the substrate;

a light irradiating step (4) of irradiating the layer obtained by partially mixing the curable composition (A1) and the curable composition (A2) with light from a side of the mold to cure the layer; and a releasing step (5) of releasing the mold from the layer formed of the curable composition (A1) and the curable composition (A2) after the curing, in which when steps from the mold contacting step (3) to the releasing step (5) are collectively called an imprinting step [Im], in a time period from an end of the laying step (2) to a beginning of the imprinting step [Im] in at least one shot area selected from the plurality of shot areas, the laying step (2) or the imprinting step [Im] is performed on a shot area different from the selected at least one shot area.

Further features of the present invention will become apparent from the following description of exemplary embodiments with reference to the attached drawings.

BRIEF DESCRIPTION OF THE DRAWINGS

FIG. 3 are schematic sectional views for illustrating a photo-nanoimprint technology according to one embodiment of the present invention.

DESCRIPTION OF THE EMBODIMENTS

First Embodiment

Figure 1:
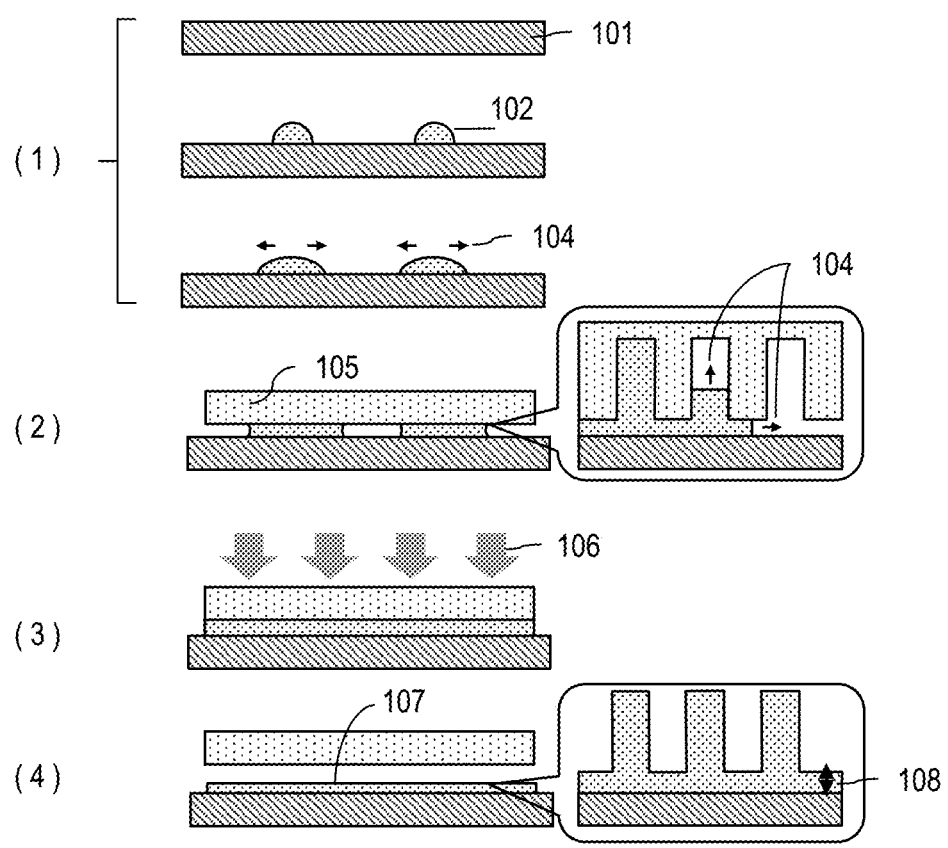
FIG. 1 are schematic sectional views for illustrating a precedent for a method for forming pattern by a photo-nanoimprint technology.

A first embodiment of the present invention is described in detail below with reference to the drawings as appropriate. However, the present invention is not limited to the embodiment to be described below. In the present invention, appropriate modifications, improvements, and the like of the embodiment to be described below that do not deviate from the gist of the present invention and are based on the ordinary knowledge of a person skilled in the art are also included in the scope of the present invention. A component (a) in a curable composition (A1) is represented as a component (a1), and the component (a) in a curable composition (A2) is represented as a component (a2). The same holds true for a component (b) to a component (d).

[Curable Composition (A)]

A curable composition (A1) and a composition (A2) (hereinafter, both also referred to as "curable composition (A)") according to the present invention are each a compound containing at least a component (a) serving as a polymerizable compound. The curable compositions according to this embodiment may each further contain a component (b) serving as a photopolymerization initiator, a component (c) serving as a non-polymerizable compound, or a component (d) serving as a solvent.

In addition, the term "cured film" as used herein means a film obtained by polymerizing and curing a curable composition (A) on a substrate. The shape of the cured film is not particularly limited, and the film may have a pattern shape on its surface.

Each component is hereinafter described in detail.

<Component (a): Polymerizable Compound>

In the present disclosure, the component (a) serving as a polymerizable compound reacts with a polymerization factor (such as a radical) generated from the component (b) serving as a photopolymerization initiator to form a film formed of a polymer compound by a chain reaction (polymerization reaction).

As such polymerizable compound, there is given, for example, a radical polymerizable compound. The component (a) serving as a polymerizable compound may be formed of only one kind of polymerizable compound or a plurality of kinds of polymerizable compounds.

It is preferred that the radical polymerizable compound be a compound having one or more acryloyl groups or methacryloyl groups, that is, a (meth)acrylic compound. Therefore, it is preferred that the curable compositions according to the present invention each contain the (meth)acrylic compound as the component (a), it is more preferred that a main component for the component (a) be the (meth)acrylic compound, and it is most preferred that the component (a) be consisted of the (meth)acrylic compound. The phrase "a main component for the component (a) is the (meth)acrylic compound" described herein means that the (meth)acrylic compound accounts for 90 wt % or more of the component (a).

When the radical polymerizable compound is formed of a plurality of kinds of compounds each having one or more acryloyl groups or methacryloyl groups, the compound preferably contains a monofunctional (meth)acrylic monomer and a multifunctional (meth)acrylic monomer. This is because the combination of the monofunctional (meth)acrylic monomer and the multifunctional (meth)acrylic monomer provides a cured film having a high mechanical strength.

Monofunctional (meth)acrylic compounds each having one acryloyl group or methacryloyl group are exemplified by, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxy diethylene glycol (meth)acrylate, polyethylene glycol mono(meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products corresponding to the monofunctional (meth)acrylic compounds include, but not limited to: ARONIX (trademark) M101, M102, M110, M111, M113, M117, M5700, TO-1317, M120, M150, and M156 (all of which are manufactured by Toagosei Co., Ltd.); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of which are manufactured by Osaka Organic Chemical Industry Ltd.); LIGHT ACRYLATE BO-A, EC-A, DMP-A, THF-A, HOP-A, HOA-MPE, HOA-MPL, PO-A, P-200A, NP-4EA, and NP-8EA, and EPOXY ESTER M-600A (all of which are manufactured by Kyoeisha Chemical Co., Ltd.); KAYARAD (trademark) TC110S, R-564, and R-128H (all of which are manufactured by Nippon Kayaku Co., Ltd.); NK Ester AMP-10G and AMP-20G (both of which are manufactured by Shin-Nakamura Chemical Co., Ltd.); FA-511A, 512A, and 513A (all of which are manufactured by Hitachi Chemical Co., Ltd.); PHE, CEA, PHE-2, PHE-4, BR-31, BR-31M, and BR-32 (all of which are manufactured by DKS); VP (manufactured by BASF); and ACMO, DMAA, and DMAPAA (all of which are manufactured by Kohjin Co., Ltd.).

In addition, multifunctional (meth)acrylic compounds each having two or more acryloyl groups or methacryloyl groups are exemplified by, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantane dimethanol di(meth)acrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercial products corresponding to the multifunctional (meth)acrylic compounds include, but not limited to: YUPIMER (trademark) UV SA1002 and SA2007 (both of which are manufactured by Mitsubishi Chemical Corporation); Viscoat #195, #230, #215, #260, #335HP, #295, #300, #360, #700, GPT, and 3PA (all of which are manufactured by Osaka Organic Chemical Industry Ltd.); LIGHT ACRYLATE 4EG-A, 9EG-A, NP-A, DCP-A, BP-4EA, BP-4PA, TMP-A, PE-3A, PE-4A, and DPE-6A (all of which are manufactured by Kyoeisha Chemical Co., Ltd.); KAYARAD (trademark) PET-30, TMPTA, R-604, DPHA, DPCA-20, -30, -60, and -120, and HX-620, D-310, and D-330 (all of which are manufactured by Nippon Kayaku Co., Ltd.); ARONIX (trademark) M208, M210, M215, M220, M240, M305, M309, M310, M315, M325, and M400 (all of which are manufactured by Toagosei Co., Ltd.); and Ripoxy (trademark) VR-77, VR-60, and VR-90 (all of which are manufactured by Showa Denko KK).

In the above-mentioned compound group, the term "(meth)acrylate" means an acrylate or a methacrylate having an alcohol residue equal to the acrylate. The term "(meth)acryloyl group" means an acryloyl group or a methacryloyl group having an alcohol residue equal to the acryloyl group. The abbreviation "EO" refers to ethylene oxide, and the term "EO-modified compound A" means a compound in which a (meth)acrylic acid residue and an alcohol residue of the compound A are bonded to each other through a block structure consisting of an oligomer or a polymer of an ethylene oxide group. Further, the abbreviation "PO" refers to propylene oxide, and the term "PO-modified compound B" means a compound in which a (meth)acrylic acid residue and an alcohol residue of the compound B are bonded to each other through a block structure consisting of an oligomer or a polymer of a propylene oxide group.

The blending ratio of the component (a1) serving as a polymerizable compound in the curable composition (A1) is desirably 50 wt % or more and 100 wt % or less with respect to the total weight of the component (a1), the component (b1), and the component (c1), i.e., the total weight of the components of the curable composition (A1) except the component (d1). In addition, the blending ratio is preferably 80 wt % or more and 100 wt % or less, more preferably more than 90 wt % and 100 wt % or less.

When the blending ratio of the component (a1) serving as a polymerizable compound in the curable composition (A1) is set to 50 wt % or more with respect to the total weight of the component (a1), the component (b1), and the component (c1), a cured film to be obtained can be turned into a cured film having some degree of mechanical strength.

The blending ratio of the component (a2) serving as a polymerizable compound in the curable composition (A2) is desirably 50 wt % or more and 99.9 wt % or less with respect to the total weight of the component (a2), the component (b2), and the component (c2), i.e., the total weight of the components of the curable composition (A2) except the component (d2). In addition, the blending ratio is preferably 80 wt % or more and 99 wt % or less, more preferably more than 90 wt % and 98 wt % or less.

When the blending ratio of the component (a2) serving as a polymerizable compound in the curable composition (A2) is set to 50 wt % or more with respect to the total weight of the component (a2), the component (b2), and the component (c2), a cured film to be obtained can be turned into a cured film having some degree of mechanical strength.

In addition, as described later, the curable composition (A1) preferably contains the component (d1), and the content of the component (a1) is desirably 0.01 wt % or more and 10 wt % or less with respect to the total weight of the components of the curable composition (A1) including the component (d1).

<Component (b): Photopolymerization Initiator>

In the present disclosure, the component (b) serving as a photopolymerization initiator is a compound that detects light having a predetermined wavelength to generate the above-mentioned polymerization factor (radical). Specifically, the photopolymerization initiator is a polymerization initiator (radical generator) that generates a radical with light (an infrared ray, a visible ray, an ultraviolet ray, a far ultraviolet ray, an X-ray, charged particle rays such as an electron beam, a radial ray). The component (b) may be formed of one kind of photopolymerization initiator or a plurality of kinds of photopolymerization initiators.

Examples of the radical generator include, but not limited to: 2,4,5-triarylimidazole dimers that may have a substituent, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone and benzophenone derivatives, such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives, such as 2-benzyl-2-dimethylamino-1-(4-morpholinophenyl)-butanone-1,2-methyl-1-[4-(methylthio)phenyl]-2-morpholino-propan-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether; benzoin and benzoin derivatives, such as methylbenzoin, ethylbenzoin, and propylbenzoin; benzyl derivatives, such as benzyl dimethyl ketal; acridine derivatives, such as 9-phenylacridine and 1,7-bis(9,9'-acridinyl)heptane; N-phenylglycine derivatives, such as N-phenylglycine; acetophenone and acetophenone derivatives, such as 3-methylacetophenone, acetophenone benzyl ketal, 1-hydroxycyclohexyl phenyl ketone, and 2,2-dimethoxy-2-phenylacetophenone; thioxanthone and thioxanthone derivatives, such as diethylthioxanthone, 2-isopropylthioxanthone, and 2-chlorothioxanthone; acylphosphine oxide derivatives, such as 2,4,6-trimethylbenzoyl diphenyl phosphine oxide, bis(2,4,6-trimethylbenzoyl) phenyl phosphine oxide, and bis-(2,6-dimethoxybenzoyl)-2,4,4-trimethylpentyl phosphine oxide; oxime ester derivatives, such as 1,2-octanedione, 1-[4-(phenylthio)-, 2-(O-benzoyloxime)] and ethanone, 1-[9-ethyl-6-(2-methylbenzoyl)-9H-carbazol-3-yl]-, 1-(O-acetyloxime); xanthone; fluorenone; benzaldehyde; fluorene; anthraquinone; triphenylamine; carbazole; 1-(4-isopropylphenyl)-2-hydroxy-2-methylpropan-1-one; and 2-hydroxy-2-methyl-1-phenylpropan-1-one.

Examples of commercial products corresponding to the radical generator include, but not limited to, Irgacure 184, 369, 651, 500, 819, 907, 784, and 2959, CGI-1700, -1750, and -1850, CG24-61, Darocur 1116 and 1173, Lucirin (trademark) TPO, LR8893, and LR8970 (all of which are manufactured by BASF), and Ubecryl P36 (manufactured by UCB).

Of those, the component (b) is preferably an acylphosphine oxide-based polymerization initiator. The acylphosphine oxide-based polymerization initiator is, of the examples described above, an acylphosphine oxide compound, such as 2,4,6-trimethylbenzoyl diphenyl phosphine oxide, bis(2,4,6-trimethylbenzoyl) phenyl phosphine oxide, or bis(2,6-dimethoxybenzoyl)-2,4,4-trimethylpentyl phosphine oxide.

In the present invention, it is preferred that the curable composition (A1) be substantially free of photoreactivity. To this end, the blending ratio of the component (b1) serving as a photopolymerization initiator in the curable composition (A1) is preferably less than 0.1 wt % with respect to the total of the component (a1), the component (b1), and the component (c1), i.e., the total weight of components of the curable composition (A1) except the component (d1). In addition, the blending ratio is more preferably 0.01 wt % or less.

When the blending ratio of the component (b1) in the curable composition (A1) is set to less than 0.1 wt % with respect to the total weight of the component (a1), the component (b1), and the component (c1), the curable composition (A1) is substantially free of photoreactivity. Accordingly, a risk in that photocuring by leaked light may occur is alleviated, and hence a pattern having a small number of non-filling defects is obtained also in an adjacent shot area even in a short filling time. The curing reaction of the curable composition (A1) in the shot area is described later.

The blending ratio of the component (b2) serving as a photopolymerization initiator in the curable composition (A2) is desirably 0.1 wt % or more and 50 wt % or less with respect to the total of the component (a2), the component (b2), and the component (c2) to be described later, i.e., the total weight of components of the component (b2) except the component (d2). In addition, the blending ratio is preferably 0.1 wt % or more and 20 wt % or less, more preferably more than 10 wt % and 20 wt % or less.

When the blending ratio of the component (b2) in the curable composition (A2) is set to 0.1 wt % or more with respect to the total of the component (a2), the component (b2), and the component (c2), the curing rate of the composition increases and hence reaction efficiency can be improved. In addition, when the blending ratio of the component (b2) is set to 50 wt % or less with respect to the total of the component (a2), the component (b2), and the component (c2), a cured film to be obtained can be turned into a cured film having some degree of mechanical strength.

<Component (c): Non-Polymerizable Compound>

The curable compositions (A1) and (A2) according to this embodiment can each further contain the component (c) serving as a non-polymerizable compound in addition to the component (a) and the component (b) described in the foregoing in accordance with various purposes to the extent that the effects of the present invention are not impaired. Such component (c) is, for example, a compound that is free of a polymerizable functional group, such as a (meth) acryloyl group, and is free of an ability to sense light having a predetermined wavelength to generate the polymerization factor (radical). Examples thereof include a sensitizer, a hydrogen donor, an internal release agent, a surfactant, an antioxidant, a polymer component, and other additives. Two or more kinds of the compounds may be incorporated as the component (c).

The sensitizer is a compound to be appropriately added for the purpose of accelerating a polymerization reaction or enhancing a reaction conversion ratio. As the sensitizer, there is given, for example, a sensitizing dye. The sensitizing dye is a compound that is excited by absorbing light having a specific wavelength to interact with the component (b) serving as a photopolymerization initiator. The term "interaction" described herein refers to, for example, the transfer of energy or an electron from the sensitizing dye in an excited state to the component (b) serving as a photopolymerization initiator.

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, and a pyrylium salt-based dye.

The sensitizers may be used alone or as a mixture thereof.

The hydrogen donor is a compound capable of reacting with an initiation radical generated from the component (b) serving as a photopolymerization initiator or the radical of a polymerization growth terminal to generate a more reactive radical. The hydrogen donor is preferably added when the growth terminal is a photoradical generator.

Specific examples of such hydrogen donor include, but not limited to, amine compounds, such as n-butylamine, di-n-butylamine, allylthiourea, triethylamine, a 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine, and mercapto compounds, such as 2-mercapto-N-phenylbenzimidazole and a mercaptopropionic acid ester, sulfur compounds, such as s-benzylisothiuronium-p-toluenesulfinate, and phosphorous compounds, such as tri-n-butylphosphine.

The hydrogen donors may be used alone or as a mixture thereof. In addition, the hydrogen donor may have a function as a sensitizer.

The internal release agent can be added to each of the curable compositions for the purpose of reducing an interfacial bonding force between a mold and a cured product of the curable composition (A), i.e., reducing a release force in a releasing step (5) to be described later. The term "internal" as used herein means that the release agent is added to the curable composition (A) prior to the step of arranging the curable composition (A).

For example, surfactants, such as a silicone-based surfactant, a fluorine-based surfactant, and a hydrocarbon surfactant, can each be used as the internal release agent. In the present invention, the internal release agent is free of polymerizability.

Examples of the fluorine-based surfactant include a polyalkylene oxide (such as polyethylene oxide or polypropylene oxide) adduct of an alcohol having a perfluoroalkyl group, and a polyalkylene oxide (such as polyethylene oxide or polypropylene oxide) adduct of perfluoropolyether. The fluorine-based surfactant may have, for example, a hydroxyl group, an alkoxy group, an alkyl group, an amino group, or a thiol group on part (for example, as a terminal group) of its molecular structure.

As the fluorine-based surfactant, a commercial product may be used. Examples of the commercial product include MEGAFACE (trademark) F-444, TF-2066, TF-2067, and TF-2068 (all of which are manufactured by DIC Corporation), Fluorad FC-430 and FC-431 (both of which are manufactured by 3M Japan Limited), SURFLON (trademark) S-382 (manufactured by AGC), EFTOP EF-122A, 122B, and 122C, EF-121, EF-126, EF-127, and MF-100 (all of which are manufactured by Mitsubishi Materials Electronic Chemicals Co., Ltd.), PF-636, PF-6320, PF-656, and PF-6520 (all of which are manufactured by OMNOVA Solutions), UNIDYNE (trademark) DS-401, DS-403, and DS-451 (all of which are manufactured by Daikin Industries, Ltd.), and Ftergent (trademark) 250, 251, 222F, and 208G (all of which are manufactured by Neos Corporation).

In addition, the internal release agent may be the hydrocarbon surfactant. The hydrocarbon surfactant includes, for example, an alkyl alcohol polyalkylene oxide adduct, in which an alkylene oxide having 2 to 4 carbon atoms is added to an alkyl alcohol having 1 to 50 carbon atoms.

Examples of the alkyl alcohol polyalkylene oxide adduct include a methyl alcohol polyethylene oxide adduct, a decyl alcohol polyethylene oxide adduct, a lauryl polyalcohol ethylene oxide adduct, a cetyl alcohol polyethylene oxide adduct, a stearyl alcohol polyethylene oxide adduct, and a stearyl alcohol polyethylene oxide/propylene oxide adduct. The terminal group of the alkyl alcohol polyalkylene oxide adduct is not limited to a hydroxyl group, which is simply produced by adding a polyalkylene oxide to an alkyl alcohol. The hydroxyl group may be converted to another substituent, for example, a polar functional group, such as a carboxyl group, an amino group, a pyridyl group, a thiol group, or a silanol group, or a hydrophobic functional group, such as an alkyl group or an alkoxy group.

As the alkyl alcohol polyalkylene oxide adduct, a commercial product may be used. Examples of the commercial product include polyoxyethylene methyl ether (methyl alcohol polyethylene oxide adduct) (BLAUNON MP-400, MP-550, and MP-1000) manufactured by Aoki Oil Industrial Co., Ltd., polyoxyethylene decyl ether (decyl alcohol polyethylene oxide adduct) (FINESURF D-1303, D-1305, D-1307, and D-1310) manufactured by Aoki Oil Industrial Co., Ltd., polyoxyethylene lauryl ether (lauryl alcohol ethylene oxide adduct) (BLAUNON EL-1505) manufactured by Aoki Oil Industrial Co., Ltd., polyoxyethylene cetyl ether (cetyl alcohol ethylene oxide adduct) (BLAUNON CH-305 and CH-310) manufactured by Aoki Oil Industrial Co., Ltd., polyoxyethylene stearyl ether (stearyl alcohol ethylene oxide adduct) (BLAUNON SR-705, SR-707, SR-715, SR-720, SR-730, and SR-750) manufactured by Aoki Oil Industrial Co., Ltd., random polymerization-type polyoxyethylene polyoxypropylene stearyl ether (BLAUNON SA-50/50 1000R and SA-30/70 2000R) manufactured by Aoki Oil Industrial Co., Ltd., polyoxyethylene methyl ether (Pluriol (trademark) A760E) manufactured by BASF, and polyoxyethylene alkyl ethers (EMULGEN Series) manufactured by Kao Chemicals.

Of those hydrocarbon surfactants, an alkyl alcohol polyalkylene oxide adduct is preferred as the internal release agent, and a long-chain alkyl alcohol polyalkylene oxide adduct is more preferred. The internal release agents may be used alone or as a mixture thereof.

The blending ratio of the component (c) serving as a non-polymerizable compound in each of the curable composition (A) is desirably 0 wt % or more and 50 wt % or less with respect to the total weight of the component (a), the component (b), and the component (c), i.e., the total weight of all components of the curable composition (A) except the component (d). In addition, the blending ratio is preferably 0.1 wt % or more and 50 wt % or less, more preferably 0.1 wt % or more and 20 wt % or less. When the blending ratio of the component (c) is set to 50 wt % or less with respect to the total weight of the component (a), the component (b), and the component (c), a cured film to be obtained can be turned into a cured film having some degree of mechanical strength.

<Component (d): Solvent>

The curable composition (A) according to the present invention may each contain the component (d) serving as a solvent. The component (d) is not particularly limited as long as the component is a solvent that dissolves the component (a), the component (b), and the component (c). The solvent is preferably a solvent having a boiling point at normal pressure of 80° C. or more and 200° C. or less. The solvent is more preferably a solvent having at least one of an ester structure, a ketone structure, a hydroxyl group, or an ether structure. The solvent is specifically, for example, a single solvent selected from propylene glycol monomethyl ether acetate, propylene glycol monomethyl ether, cyclohexanone, 2-heptanone, γ-butyrolactone, and ethyl lactate, or a mixed solvent of two or more kinds thereof.

The curable composition (A1) according to this embodiment preferably contains the component (d1). This is because, as described later, spin coating is preferred as a method of applying the curable composition (A1) onto the substrate.

<Temperature at Time of Blending of Curable Composition (A)>

When the curable compositions (A1) and (A2) of this embodiment are prepared, each components are mixed and dissolved under a predetermined temperature condition. Specifically, the preparation is performed in a range of from 0° C. or more to 100° C. or less.

<Viscosity of Curable Composition (A)>

The curable compositions (A1) and (A2) according to the present invention are preferably liquid. This is because in a mold contacting step (3) to be described later, the spread and fill of the curable composition (A1) and/or the curable composition (A2) are quickly completed, in other words, a filling time is short.

The viscosity of the mixture of the components except the solvent (component (d1)) of the curable composition (A1) according to the present invention at 25° C. is preferably 20 mPa·s or more and 10,000 mPa·s or less. In addition, the viscosity is more preferably 20 mPa·s or more and 1,000 mPa·s or less. In order to shorten the filling time, the mixture is preferably a liquid. However, a liquid having a viscosity as low as 20 mPa·s or less is affected by the airflow of an atmosphere-controlling gas 210 of FIG. 2(3), and hence the distribution of the thickness or composition of the liquid film of the curable composition (A1) 202 is liable to occur. In the worst case, such a problem as described below occurs: the curable composition (A1) 202 is not present only in an affected region owing to its vaporization or movement. In addition, the curable composition (A1) having a viscosity as high as 10,000 mPa·s or more causes a problem in that a shortening effect on the filling time serving as the original object reduces.

The viscosity of the mixture of the components except the solvent (component (d2)) of the curable composition (A2) according to the present invention at 25° C. is preferably 1 mPa·s or more and less than 40 mPa·s. In addition, the viscosity is more preferably 1 mPa·s or more and less than 20 mPa·s. When the viscosity of the curable composition (A2) is higher than 40 mPa·s, the composition cannot be applied by the inkjet system in which liquid droplets are arranged discretely in accordance with the density of a desired pattern to uniformize the thickness of a residual film, and hence a high-accuracy pattern can be formed. In addition, the case where the viscosity is lower than 1 mPa·s is not preferred because application unevenness may occur owing to the flow of the composition at the time of its application (arrangement), or the composition may flow out of an end portion of the mold in the contacting step to be described later.

<Surface Tension of Curable Composition (A)>

With regard to the surface tension of each of the curable compositions (A1) and (A2) according to the present invention, the surface tension of the composition of the components except the component (d) serving as a solvent at 23° C. is preferably 5 mN/m or more and 70 mN/m or less. In addition, the surface tension is more preferably 7 mN/m or more and 50 mN/m or less, still more preferably 10 mN/m or more and 40 mN/m or less. In this case, as the surface tension becomes higher, e.g., 5 mN/m or more, a stronger capillary force acts, and hence filling (the spread and the fill) is completed within a shorter time period at the time of the bringing of the curable composition (A1) and/or the curable composition (A2) into contact with the mold (S. Reddy, R.T. Bonnecaze/Microelectronic Engineering, 82 (2005) 60-70). In addition, when the surface tension is set to 70 mN/m or less, a cured film obtained by curing the curable compositions becomes a cured film having surface smoothness.

In this embodiment, the surface tension of the curable composition (A1) except the component (d1) serving as a solvent is preferably higher than the surface tension of the curable composition (A2) except the component (d2) serving as a solvent. This is because of the following reason. Before the mold contacting step (3), the prespread of the curable composition (A2) is accelerated (liquid droplets spread over a wide range) by a Marangoni effect to be described later, and hence a time period required for spread in the mold contacting step (3) to be described later is shortened. As a result, a filling time is shortened.

The Marangoni effect is a free surface movement phenomenon resulting from a local difference in surface tension between liquids (N. Imaishi/Int. J. Microgravity Sci. No. 31 Supplement 2014 (S5-S12)). The difference in surface tension, in other words, the difference in surface energy serves as a driving force to cause such diffusion that a liquid having a low surface tension covers a wider surface. In other words, when the curable composition (A1) having a high surface tension is applied to the entire surface of the substrate and the curable composition (A2) having a low surface tension is dispensed dropwise, the prespread of the curable composition (A2) is accelerated.

<Contact Angle of Curable Composition (A)>

With regard to the contact angle of each of the curable compositions (A1) and (A2) according to the present invention, the contact angle of the composition formed of the components except the component (d) serving as solvent is preferably 00 or more and 90° or less with respect to each of both the surface of the substrate and the surface of the mold. When the contact angle is more than 90°, a capillary force acts in a negative direction (direction in which a contact interface between the mold and the curable composition is shrunk) in a mold pattern or in a gap between the substrate and the mold, and hence the composition is not filled. In addition, the contact angle is particularly preferably 00 or more and 30° or less. As the contact angle becomes lower, a stronger capillary force acts and hence a filling rate increases (S. Reddy, R.T. Bonnecaze/Microelectronic Engineering, 82 (2005) 60-70).

<Impurities Mixed in Curable Composition (A)>

It is preferred that the curable compositions (A1) and (A2) according to the present invention each be free of impurities to the extent possible. The term "impurities" as used herein refers to components except the component (a), the component (b), the component (c), and the component (d) described above.

Thus, it is preferred that the curable composition (A) according to the present invention each be obtained through a purification step. The purification step is preferably filtration using a filter or the like. When the filtration using a filter is performed, specifically, it is preferred that the component (a) and the component (b) described in the foregoing and additive components to be added as required be mixed, and then the mixture be filtered with a filter having a pore diameter of, for example, 0.001 µm or more and 5.0 µm or less. It is more preferred that the filtration using a filter be performed in a plurality of stages or be repeated a plurality of times. In addition, the filtered liquid may be filtered again. A plurality of filters having different pore diameters may be used to perform the filtration. A filter made of, for example, a polyethylene resin, a polypropylene resin, a fluororesin, or a nylon resin can be used as the filter to be used in the filtration. However, the filter is not particularly limited thereto.

Impurities, such as particles, which are mixed in the curable composition (A), can be removed through such purification step. Thus, the impurities, such as the particles, can be prevented from forming unexpected unevenness in the cured film to be obtained after the curable compositions are cured to cause a pattern defect.

When the curable composition (A) according to the present invention are used for the manufacture of a semiconductor integrated circuit, it is preferred to avoid the mixing of metal atom-containing impurities (metal impurities) in the curable composition (A) to the extent possible in order to prevent the operation of a product from being inhibited. In this case, the concentration of the metal impurities in the curable compositions is preferably 10 ppm or less, more preferably 100 ppb or less.

[Pattern Forming Method]

Next, a pattern forming method according to the present invention is described with reference to the schematic sectional views of FIG. 3.

The pattern forming method according to the present invention is one mode of the photo-nanoimprint method. The pattern forming method of the present invention includes:

a laying step (1) of laying the curable composition (A1) 302 of the present invention described in the foregoing on a substrate 301;

a laying step (2) of laying the curable composition (A2) 303 on the layer of the curable composition (A1) 302;

a mold contacting step (3) of sandwiching the layer obtained by mixing the curable composition (A1) 302 and the curable composition (A2) 303 between the mold 308 and the substrate 301;

a light irradiating step (4) of irradiating the layer obtained by partially mixing the curable composition (A1) 302 and the curable composition (A2) 303 with irradiation light 307 from a side of the mold 308 to cure the layer in one stroke; and a releasing step (5) of releasing the mold 308 from the layer formed of the curable compositions (the cured film 310 having a pattern shape) after the curing, in which:

a required time Td for the laying step (2) is equal to a total required time Ti for the mold contacting step (3), the light irradiating step (4), and the releasing step (5); and after the laying step (2) has been continuously performed on a plurality of shot areas, the mold contacting step (3), the light irradiating step (4), and the releasing step (5) are performed on each of the shot areas on which the laying step (2) has already been performed in the order in which the laying step (2) has been performed.

A cured film 310 having a pattern shape obtained by the method of manufacturing according to the present invention is preferably a film having a pattern having a size of 1 nm or more and 10 mm or less. In addition, the cured film is more preferably a film having a pattern having a size of 10 nm or more and 100 µm or less. In general, a pattern forming technology for producing a film having a pattern (uneven structure) of a nanosize (1 nm or more and 100 nm or less) through the use of light is called a photo-nanoimprint method. The pattern forming method according to the present invention uses the photo-nanoimprint method. Each step is hereinafter described.

<Laying Step (1)>

In this step (laying step (1)), as illustrated in FIG. 3(1), a curable composition (A1) 302 according to this embodiment described in the foregoing is laid (applied) onto a substrate 301 to form an applied film.

The substrate 301 on which the curable composition (A1) 302 is to be arranged is a substrate to be processed, and a silicon wafer is typically used. A layer to be processed may be formed on the substrate 301. Another layer may be further formed between the substrate 301 and the layer to be processed. In addition, when a quartz substrate is used as the substrate 301, a replica of a quartz imprint mold (quartz mold replica) can be produced.

However, the substrate 301 is not limited to the silicon wafer and the quartz substrate. The substrate 301 can be arbitrarily selected from substrates known as substrates for semiconductor devices, such as aluminum, a titanium-tungsten alloy, an aluminum-silicon alloy, an aluminum-copper-silicon alloy, silicon oxide, and silicon nitride.

The adhesiveness of the surface of the substrate 301 (substrate to be processed) to be used or of the layer to be processed with each of the curable composition (A1) 302 and the curable composition (A2) 303 may be improved by a surface treatment, such as a silane coupling treatment, a silazane treatment, or the formation of an organic thin film.

In the present invention, as a method of arranging the curable composition (A1) 302 on the substrate 301 or the layer to be processed, there may be used, for example, an inkjet method, dip coating, air knife coating, curtain coating, wire bar coating, gravure coating, extrusion coating, spin coating, or a slit scan method. In the present invention, spin coating is particularly preferred.

When the curable composition (A1) 302 is arranged on the substrate 301 or the layer to be processed by using the spin coating, the component (d1) serving as a solvent may be volatilized by performing a baking step as required.

The average thickness of the curable composition (A1) 302, which varies depending on applications where the cured film is used, is, for example, 0.1 nm or more and 10,000 nm or less, preferably 1 nm or more and 20 nm or less, particularly preferably 1 nm or more and 10 nm or less.

<Laying Step (2)>

In the laying step (2), as illustrated in FIG. 3(2), liquid droplets of a curable composition (A2) 303 are preferably dispensed dropwise discretely and arranged on the layer of the curable composition (A1). The inkjet method is particularly preferred as a method for the arrangement. The liquid droplets of the curable composition (A2) 303 are densely arranged on a substrate facing a region where groove portions are densely present on the mold, and are sparsely arranged on a substrate facing a region where groove portions are sparsely present. Thus, the thickness of a residual film to be described later can be controlled to a uniform value irrespective of the density of a pattern on the mold.

The liquid droplets of the curable composition (A2) 303 arranged in this step are quickly spread by the Marangoni effect using a difference in surface energy (surface tension) as a driving force (prespread). When the curable composition (A1) 302 is substantially free of photoreactivity, as a result of the mixing of the curable composition (A1) 302 and the curable composition (A2) 303, the component (b2) serving as a photopolymerization initiator of the curable composition (A2) 303 migrates to the curable composition (A1) 302, and hence the curable composition (A1) 302 obtains photosensitivity for the first time.

Figure 2:
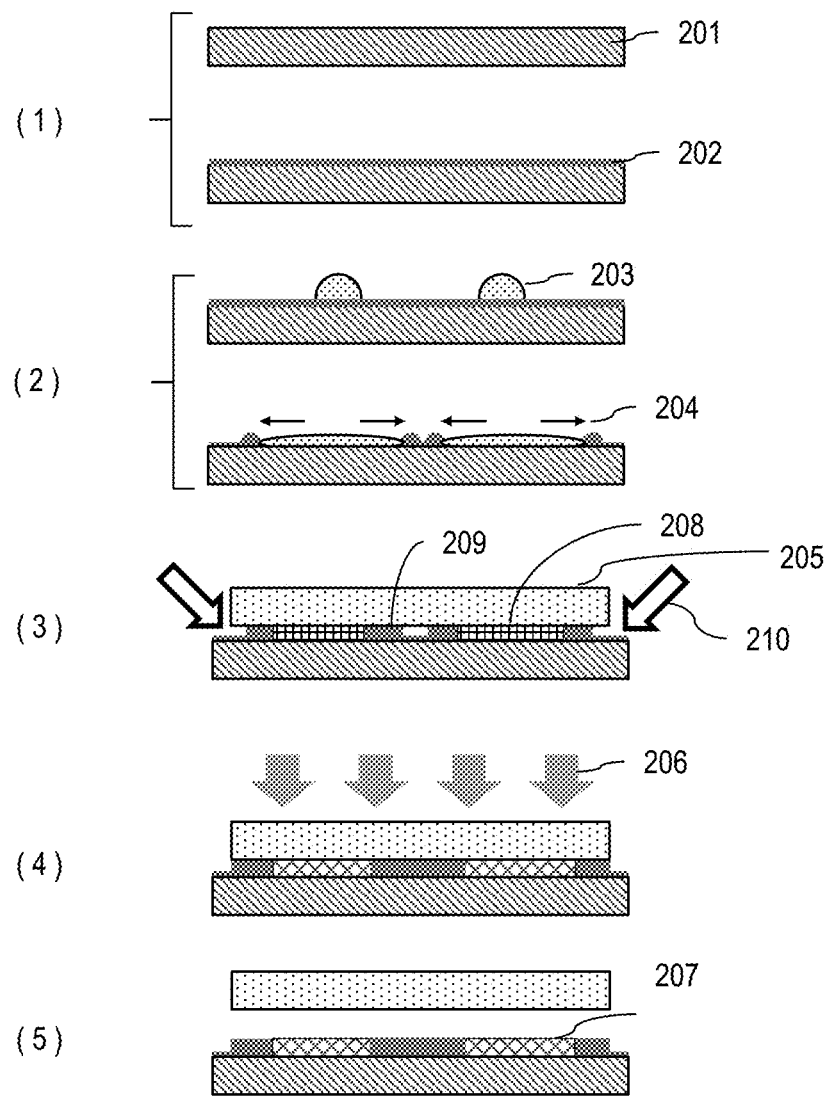
FIG. 2 are schematic sectional views for illustrating a problem to be solved by the present invention.

The mixing of the curable composition (A1) 302 and a liquid droplet of the curable composition (A2) 303 in a shot area depends on mutual diffusion based on a difference in composition, and hence it takes a time as long as from several seconds to several tens of seconds for the composition to become uniform. When the time period for which the curable composition (A2) 203 is diffused into the curable composition (A1) 202 is insufficient, as illustrated in FIG. 2(3), the area 209 where the mixing of the curable composition (A1) 202 and of the curable composition (A2) 203 is not sufficient occurs. For example, when the dry etching resistance of the curable composition (A1) 202 is lower than that of the curable composition (A2) 203, the area 209 where the mixing of the curable composition (A1) 202 and of the curable composition (A2) 203 is not sufficient has low dry etching resistance. The area having low dry etching resistance serves as a defect at the time of etching in a subsequent step. In the related-art pattern forming method illustrated in FIG. 2(2) to FIG. 2(5) in which the imprinting step including the mold contacting step (3) to the releasing step (5) being sequentially performed for each shot area after finishing of the laying step (2), when a standby step (M) of stopping a step for mixing the curable composition (A1) 202 and the curable composition (A2) 203 is provided after the laying step (2), the curable composition (A1) 302 and of the curable composition (A2) 303 are sufficiently mixed. However, a total required time per shot lengthens by a required time for the standby step [M], and as a result, throughput reduces.

In view of the foregoing, in order that the curable composition (A1) and the curable composition (A2) may be sufficiently mixed, in the present invention, it has been found that the curable composition (A1) 302 and the curable composition (A2) 303 can be sufficiently mixed by performing the laying step (2) or the imprinting step (Im) on the shot area other than the first shot area (shot area S(1)) 304 where the laying step (2) is finished after the completion of the laying step (2) and the initiation the imprinting step (Im) as illustrated in FIG. 3. For example, as a prosecution of the laying step (2) and the imprinting step (Im), the laying step (2) is performed such that the liquid droplets of the curable composition (A2) are continuously dispensed dropwise discretely onto a plurality of shot areas on the layer of the curable composition (A1) 302 i.e. the first shot area (shot area S(1)) 304, the second shot area (shot area S(2)) 305, and "n"th shot area (shot area S(n)) 306 as illustrated in FIG. 3(2); and then the imprinting step (Im) is continuously performed in the order in the shot area S(1) 304, the shot area S(2) 305, and the shot area S(n) 306 where the laying step (2) has been performed as illustrated in FIG. 3(3). Since the curable composition (A2) 303 is continuously arranged in the shot area S(1) 304, the shot area S(2) 305, and the shot area S(n) 306, the adjustment of the number of shot areas on which the laying step (2) is continuously performed can secure a time interval from the laying step (2) to the mold contacting step (3) per shot area (hereinafter referred to as "mixing interval") sufficiently long as compared to that in the related-art pattern forming method in which the laying step (2) to the releasing step (5) are continuously performed for one shot area. Accordingly, the curable composition (A1) 302 and the curable composition (A2) 303 can be sufficiently mixed. A number n of the shot areas where the plurality of shot is performed is preferably a shot area number satisfying (Formula 1) below, and the n is more preferably equal to Tm/Td+1. In addition, when the thickness of the curable composition (A1) is 6 nm and the liquid droplet volume of the curable composition (A2) is 1 pL, the mixing interval is considered to be preferably 1.5 seconds or more.

$$n \geq Tm/Td+1 \quad \text{(Formula 1)}$$

(In the formula, n represents the number of shot areas on which the laying step (2) is, or the mold contacting step (3) to the releasing step (5) are, continuously performed, and n represents an integer, Tm represents a time required for the mixing of the curable composition (A1) 302 and the curable composition (A2) 303 that have been laid, and Td represents a required time for the laying step (2) per shot area.)

According to another aspect of the pattern forming method of the present invention, the laying step (2) and the imprinting step [Im] are performed as follows:

That is, the laying step (2) on one shot area selected from a plurality of the shot areas and the imprinting step [Im] on another shot area selected from a plurality of the shot areas where the laying step (2) has been performed are simultaneously performed. Specifically, after the laying step (2) has been sequentially performed on a first plurality of shot areas (S(1), S(2), ..., S(m)), where m represents an integer of 2 or more, selected from the plurality of shot areas, the laying step (2) on a second plurality of shot areas (S(m+1), S(m+2), ..., S(2m)) selected from the plurality of shot areas, the second plurality of shot areas being identical in number to the first plurality of shot areas, and the imprinting step [Im] on the first plurality of shot areas (S(1), S(2), ..., S(m)) are simultaneously and sequentially performed in a concurrent manner.

Further, as a method to perform the laying step (2) and the imprinting step [Im]:

after the laying step (2) has been sequentially performed on a first plurality of shot areas (S(1), S(2), ..., S(m)), where m represents an integer of 2 or more, selected from the plurality of shot areas, the imprinting step [Im] on the shot area (S(1)) and the laying step (2) on a shot area (S(m+1)) are alternately performed, and hereafter similarly, the imprinting step [Im] on a shot area (S(p)), where p represents an integer of 2 or more, and the laying step (2) on a shot area (S(p+m)) are alternately performed. When the laying step (2) is sequentially performed on the plurality of shot areas (S(1), S(2), ..., S(m)), a standby time having the same length as that of a time required for performance of the imprinting step [Im] on one shot area is arranged in a time period from performance of the laying step (2) on one shot area to performance of the laying step (2) on a next shot area.

Furthermore, according to another aspect of the pattern forming method of the present invention, the laying step (2) and the imprinting step [Im] are performed as follows: the laying step (2) and the imprinting step [Im] may be performed on a plurality of substrates with one dispenser and one imprint head. That is, the laying step (2) on one shot area on a first substrate and the imprinting step [Im] on one shot area on a second substrate is simultaneously performed.

Regarding a time Td required for the laying step (2) and a time Ti required for the imprinting step [Im], it is desirable that Td and Ti be equal to each other.

<Mold Contacting Step (3)>

Next, as illustrated in FIG. 3(3), a mold 308 having a template pattern for transferring a pattern shape is brought into contact with a mixture 309 obtained by mixing the curable composition (A1) 302 and the curable composition (A2) 303, the liquid being formed in the previous steps (laying step (1) and laying step (2)). Thus, a groove portion of a fine pattern on the surface of the mold 308 is filled with the mixture 309 obtained by partially mixing the curable composition (A1) 302 and the curable composition (A2) 303, and hence a liquid film filled into the fine pattern of the mold is obtained.

The mold 308 that is formed of an optically transparent material is desirably used as the mold 308 considering the next light irradiating step (4). Preferred specific examples of the material for forming the mold 308 include glass, quartz, an optically transparent resin, such as PMMA or a polycarbonate resin, a transparent metal-deposited film, a flexible film made of polydimethylsiloxane or the like, a photocured film, and a metal film. In the case of using the optically transparent resin as the material for forming the mold 308, it is necessary to select a resin that does not dissolve in a component contained in the curable composition (A1) 302 and the curable composition (A2) 303. Quartz is particularly preferred as the material for forming the mold 308 because of its small thermal expansion coefficient and small pattern deformation.

The fine pattern on the surface of the mold 308 preferably has a pattern height of 4 nm or more and 200 nm or less. As the pattern height becomes lower, the force by which the mold 308 is peeled from the cured film 310 having a pattern shape in the releasing step (5), i.e., a release force reduces, and the number of release defects remaining on a mask side owing to the tearing-off of a resist pattern in association with the release reduces. Adjacent resist patterns are brought into contact with each other by the elastic deformation of the resist patterns due to an impact at the time of the peeling of the mold, and hence the resist patterns adhere to each other or are damaged in some cases. However, when the pattern height is about twice or less as large as a pattern width (an aspect ratio is 2 or less), there is a high possibility that such inconveniences can be avoided. Meanwhile, when the pattern height is excessively low, the processing accuracy of the substrate to be processed is low.

The mold 308 may be subjected to a surface treatment before this step, which is a mold contacting step (3) of the curable composition (A1) 302 and the curable composition (A2) 303 and the mold 308, so as to enhance the releasability between the curable composition (A1) 302 and the curable composition (A2) 303 and the surface of the mold 308. As a method for the surface treatment, there is given a method involving forming a release agent layer by applying a release agent onto the surface of the mold 308. In this case, examples of the release agent to be applied onto the surface of the mold 308 include a silicon-based release agent, a fluorine-based release agent, a hydrocarbon-based release agent, a polyethylene-based release agent, a polypropylene-based release agent, a paraffin-based release agent, a montan-based release agent, and a carnauba-based release agent. For example, a commercially available application-type release agent such as OPTOOL (trademark) DSX manufactured by Daikin Industries, Ltd. can be suitably used. The release agents may be used alone or in combination thereof. Of those, fluorine-based and hydrocarbon-based release agents are particularly preferred.

A pressure to be applied to the curable composition (A1) 302 and the curable composition (A2) 303 when the mold 308 and the curable composition (A1) 302 and the curable composition (A2) 303 are brought into contact with each other in this step as illustrated in FIG. 3(3) is not particularly limited. The pressure is desirably set to 0 MPa or more and 100 MPa or less. In addition, the pressure is preferably 0 MPa or more and 50 MPa or less, more preferably 0 MPa or more and 30 MPa or less, still more preferably 0 MPa or more and 20 MPa or less.

In the laying step (2), the prespread of the liquid droplets of the curable composition (A2) 303 has progressed in the order in the shot area S(1) 304, the shot area S(2) 305, and the shot area S(n) 306, and hence the spread of the curable composition (A2) 303 in each shot areas in this step is quickly completed.

As described above, the spread and fill of the curable composition (A1) 302 and the curable composition (A2) 303 in each shot areas are quickly completed in this step, and hence the time period for which the mold 308, and the curable composition (A1) 302 and the curable composition (A2) 303 are brought into contact with each other can be set to be short. In other words, one of the effects of the present invention is as follows: many pattern forming steps can be completed within a short time period, and hence high productivity is obtained. The time period for which the mold and the compositions are brought into contact with each other, which is not particularly limited, is desirably set to, for example, 0.1 second or more and 600 seconds or less. In addition, the time period is preferably 0.1 second or more and 3 seconds or less, particularly preferably 0.1 second or more and 1 second or less. When the time period is shorter than 0.1 second, the following tendency is observed: the spread and the fill become insufficient, and hence many defects called non-filling defects occur.

Although this step can be performed under any condition of an air atmosphere, a reduced pressure atmosphere, and an inert gas atmosphere, this step is preferably performed under a reduced pressure atmosphere or an inert gas atmosphere in which an inert gas is used as an atmosphere-controlling gas because an influence of oxygen or moisture on a curing reaction can be prevented. Specific examples of the inert gas that can be used when this step is performed under an inert gas atmosphere include nitrogen, carbon dioxide, helium, argon, various chlorofluorocarbon gases, and mixed gases thereof. When this step is performed under a specific gas atmosphere including an air atmosphere, a preferred pressure is 0.0001 atm or more and 10 atm or less.

The mold contacting step (3) may be performed under an atmosphere containing a condensable gas (hereinafter referred to as "condensable gas atmosphere") using the condensable gas as the atmosphere-controlling gas. The term "condensable gas" as used herein refers to the following gas: when the gas in the atmosphere is filled into a groove portion of the fine pattern formed on the mold 308, and the gap between the mold 308 and the substrate 301 together with the curable composition (A1) 302 and the curable composition (A2) 303, the gas is condensed by a capillary pressure generated at the time of the filling to liquefy. The condensable gas is present as a gas in the atmosphere before the curable composition (A1) 302 and the curable composition (A2) 303, and the mold 308 are brought into contact with each other in the mold contacting step (3) (for reference: expanded part of FIG. 1(2)).

When the mold contacting step (3) is performed under the condensable gas atmosphere, the gas filled into a groove portion of the fine pattern is liquefied by a capillary pressure generated by the curable composition (A1) 302 and the curable composition (A2) 303, and hence air bubbles disappear. Accordingly, a filling property becomes excellent. The condensable gas may dissolve in the curable composition (A1) 302 and/or the curable composition (A2) 303.

The boiling point of the condensable gas, which is not limited as long as the boiling point is equal to or less than the ambient temperature of the mold contacting step (3), is preferably from −10° C. to 23° C., more preferably from 10° C. to 23° C. When the boiling point falls within the range, the filling property is more excellent.

The vapor pressure of the condensable gas at the ambient temperature in the mold contacting step (3), which is not limited as long as the vapor pressure is equal to or less than a mold pressure when impression is performed in the mold contacting step (3), is preferably from 0.1 MPa to 0.4 MPa. When the vapor pressure falls within the range, the filling property is more excellent. When the vapor pressure at the ambient temperature is more than 0.4 MPa, the following tendency is observed: an air bubble disappearing effect cannot be sufficiently obtained. On the other hand, when the vapor pressure at the ambient temperature is less than 0.1 MPa, the following tendency is observed: decompression is needed and hence an apparatus becomes complicated. The ambient temperature in the mold contacting step (3), which is not particularly limited, is preferably from 20° C. to 25° C.

Specific examples of the condensable gas include fluorocarbons, such as: a chlorofluorocarbon (CFC), such as trichlorofluoromethane; a fluorocarbon (FC); a hydrochlorofluorocarbon (HCFC); a hydrofluorocarbon (HFC), such as 1,1,1,3,3-pentafluoropropane ($CHF_2CH_2CF_3$, HFC-245fa, PFP); and a hydrofluoroether (HFE), such as pentafluoroethyl methyl ether ($CF_3CF_2OCH_3$, HFE-245mc).

Of those, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferred from such a viewpoint that when the ambient temperature in the mold contacting step (3) is from 20° C. to 25° C., the filling property is excellent. Further, 1,1,1,3,3-pentafluoropropane is particularly preferred from the viewpoint of being excellent in safety.

The condensable gases may be used alone or as a mixture thereof. In addition, any such condensable gas may be mixed with a non-condensable gas, such as air, nitrogen, carbon dioxide, helium, or argon, before use. The non-condensable gas with which the condensable gas is mixed is preferably helium from the viewpoint of the filling property. Helium can permeate the mold 205. Accordingly, when the gases (the condensable gas and helium) in the atmosphere are filled into a groove portion of the fine pattern formed on the mold 308 in the mold contacting step (3) together with the curable composition (A1) 302 and/or the curable composition (A2) 303, the condensable gas liquefies and helium permeates the mold.

<Light Irradiating Step (4)>

Next, as illustrated in FIG. 3(3), a mixture 309 obtained by partially mixing the curable composition (A1) 302 and the curable composition (A2) 303 is irradiated with irradiation light 307 through the mold 308. In more detail, the curable composition (A1) 302 and/or the curable composition (A2) 303 filled into the fine pattern of the mold 303 are/is irradiated with the irradiation light 307 through the mold 308 in the order in the shot area S(1) 304, the shot area S(2) 305, and the shot area S(n) 306. Thus, the curable composition (A1) 302 and/or the curable composition (A2) 303 filled into the fine pattern of the mold 308 are/is cured by the irradiation light 307 to become a cured film 310 having a pattern shape in one stroke.

In this case, light 307 with which the curable composition (A1) 302 and/or the curable composition (A2) 303 filled into the fine pattern of the mold 308 are/is irradiated in one stroke is selected depending on the sensitive wavelengths of the curable compositions (A1) 302 and (A2) 303 in one stroke. Specifically, it is preferred that UV light having a wavelength of 150 nm or more and 400 nm or less, an X-ray, an electron beam, or the like be appropriately selected and used.

Of those, UV light is particularly preferably as the irradiation light 307. This is because many of the compounds commercially available as curing aids (photopolymerization initiators) have sensitivity to UV light. In this case, examples of the light source of UV light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and an $F_2$ excimer laser. Of those, an ultra-high pressure mercury lamp is particularly preferred. In addition, the number of the light sources to be used may be one or two or more. In addition, the entire surface of the curable composition (A1) 302 and/or the curable composition (A2) 303 filled into the fine pattern of the mold 308 may be irradiated with light, or a part of the surface thereof may be irradiated with light.

In addition, the light irradiation may be performed on a shot area on the substrate 301 intermittently a plurality of times, or may be continuously performed on the entire region. Further, the following may be performed: a partial region A is irradiated with the light in a first irradiating process, and a region B different from the region A is irradiated with the light in a second irradiating process.

In the light irradiating step (4), as described in the foregoing, leaked light, in other words, the diffusion of the light to the outside of the shot area is inevitable in terms of restrictions on costs for the mold and an apparatus.

In the present invention, the curable composition (A1) is substantially free of the photopolymerization initiator component (b1) (its content is less than 0.1 wt %), and hence the curable composition (A1) alone is not cured by the light irradiation. Accordingly, the curable composition (A1) on an adjacent shot area is not cured by the leaked light generated from the shot. Accordingly, also in the adjacent shot, a pattern having a small number of non-filling defects can be formed over the entire area thereof in a short filling time.

Meanwhile, in the shot, as described in the foregoing, as a result of the mixing of the curable composition (A1) and the curable composition (A2), the photopolymerization initiator component (b2) of the curable composition (A2) migrates to the curable composition (A1), and hence the curable composition (A1) obtains photosensitivity. Accordingly, both the curable compositions (A1) and (A2) are cured by the light with which the compositions are irradiated to form the cured film 310 having a pattern shape.

<Releasing Step (5)>

Next, the cured film 310 having a pattern shape and the mold 308 are released from each other. In this step, as illustrated in FIG. 3(3), the cured film 310 having a pattern shape and the mold 308 are released from each other in the order in the shot area S(1) 304, the shot area S(2) 305, and the shot area S(n) 306. In light irradiating step (4), the cured film 310 having a pattern shape serving as the reverse pattern of the fine pattern formed on the mold 308 is obtained in an independent state. A cured film remains in a groove portion of the groove/land pattern of the cured film 310 having a pattern shape, and the film is called a residual film (for reference: residue film 108 in expanded part of FIG. 1(4)).

When the mold contacting step (3) is performed under the condensable gas atmosphere, the condensable gas vaporizes in association with a reduction in pressure of the interface at which the cured film 310 having a pattern shape and the mold 308 are in contact with each other at the time of the release of the cured film 310 and the mold 308 in the releasing step (5). Thus, a reducing effect on the release force serving as a force needed for releasing the cured film 310 having a pattern shape and the mold 308 from each other tends to be exhibited.

A method of releasing the cured film 310 having a pattern shape and the mold 308 from each other is not particularly limited as long as part of the cured film 310 having a pattern shape is not physically damaged at the time of the release, and various conditions and the like are also not particularly limited. For example, the following may be performed: the substrate 301 (substrate to be processed) is fixed and the mold 308 is peeled by being moved so as to recede from the substrate 301. Alternatively, the following may be performed: the mold 308 is fixed and the substrate 301 is peeled by being moved so as to recede from the mold. Alternatively, both the substrate and the mold may be peeled from each other by being pulled in directions diametrically opposite to each other.

A cured film having a desired groove/land pattern shape (pattern shape associated with the groove/land shape of the mold 308) at a desired position can be obtained by a process (production process) including the continuous performance of the laying step (1) and the laying step (2) on the plurality of shot areas, and the continuous performance of the steps (3) to (5) on the plurality of shot areas described above.

<Coating Material for Imprint Pretreatment (Curable Composition (A1)), Imprint Resist (Curable Composition (A2)), and Set Thereof>

According to another embodiment of the present invention described above, there is provided a coating material for imprint pretreatment configured to accelerate, by forming a liquid film serving as an imprint pretreatment coating on a substrate and dispensing a liquid droplet of an imprint resist to the liquid film, the spread of a liquid droplet component in a substrate surface direction.

That is, the present invention includes a coating material for imprint pretreatment, including a curable composition (A1), the coating material for imprint pretreatment being configured to accelerate, by forming a liquid film serving as an imprint pretreatment coating on a substrate and dispensing a liquid droplet formed of a curable composition (A2) to the liquid film, spread of a liquid droplet component in a substrate surface direction, in which: the curable composition (A1) contains at least a component (a1) serving as a polymerizable compound; and when an area where a layer obtained by mixing the curable composition (A2) and the curable composition (A1) under a state in which a mold is brought into contact with the compositions is cured is defined as a shot area, a continuous liquid film arranged to cover a plurality of shot areas on a surface of the substrate is formed.

In particular, the surface tension of a composition of a component of the coating material for imprint pretreatment except a solvent is preferably higher than the surface tension of a composition of a component of the imprint resist except a solvent.

Thus, the spread of the liquid droplet component in the substrate surface direction is accelerated by dispensing the liquid droplet to the liquid film, and hence a suitable imprint can be achieved.

In particular, the coating material for imprint pretreatment is preferably provided as a set in which the imprint resist and the coating material for imprint pretreatment are combined with each other.

That is, a suitable imprint is achieved by providing the coating material for imprint pretreatment as a set in which the imprint resist and the coating material for imprint pretreatment are combined with each other so as to satisfy the following relationship: the surface tension of the composition of the components of the coating material for imprint pretreatment except the solvent is higher than the surface tension of the composition of the components of the imprint resist except the solvent.

Further, a set in which the imprint resist and the coating material for imprint pretreatment are combined with each other so that a difference between the surface tension of the composition of the components of the coating material for imprint pretreatment except the solvent and the surface tension of the composition of the components of the imprint resist except the solvent may be 1 mN/m or more and 25 mN/m or less is more preferred.

Measurement of Surface Tension

The surface tension of a composition except the solvent component (d1) of the curable composition (A1) at 25° C. was measured with Automatic Surface Tensiometer DY-300 (manufactured by Kyowa Interface Science Co., Ltd.) by a plate method involving using a platinum plate. The measurement was performed under the conditions of a number of times of the measurement of 5 and a pre-wet immersion distance of the platinum plate of 0.35 mm. The first measured value was excluded, and the average of the second to fifth measured values was defined as the surface tension.

TABLE 1

Composition table of curable composition (A1) and curable composition (A2) (part(s) by weight)

| | Component (a1) | Component (b1) | Component (c1) | Component (d1) | Viscosity (mPa · s) | Surface tension (mN/m) |
|---|---|---|---|---|---|---|
| Curable composition (A1-1) | TMPTA (100) | None | None | PGMEA (33,000) | 84.7 | 35.5 |
| Curable composition (A1-2) | DCPDA (25)/ V#335 (75) | | | | 26.0 | 38.5 |
| Curable composition (A1-3) | ADDA (100) | | | | 151.6 | 38.1 |
| Curable composition (A2-1) | IB-XA (9) V#160 (38) NP-A (47) | I.369 (3) | DEO-15 (1.1) | None | 4.02 | 29.08 |

In addition, according to another aspect of the present invention, there is also provided a suitable pretreatment method for a substrate for performing an imprint by coating the top of the substrate with the coating material for imprint pretreatment.

In addition, the present invention also includes a pattern forming method for forming a pattern on a substrate. When the method includes a step of dispensing a resist dropwise discretely onto the substrate coated with the coating material for imprint pretreatment, the spread of a resist component in a substrate surface direction is accelerated, and hence a time period required for an imprint can be shortened.

EXAMPLES

Examples 1 to 3, and Comparative Examples 1 and 2

The terms "part(s)" and "%" to be used below are by weight in all cases unless otherwise stated.

Curable compositions are prepared by mixing the composition of the components (a1) to (d1) as shown in Table 1. Methods of measuring their viscosities and surface tensions are as described below. The results are shown in Table 1.

Measurement of Viscosity

The viscosity of a composition except the solvent component (d1) of the curable composition (A1) at 25° C. was measured with a conical-flat type rotational viscometer RE-85L (manufactured by Toki Sangyo Co., Ltd.). The first measured value was excluded, and the average of the second to fifth measured values was defined as the viscosity.

The names and the manufacturers of the reagents used for the compositions are as follows.

Propylene glycol monomethyl ether acetate (manufactured by Tokyo Chemical Industry Co., Ltd., abbreviation: PGMEA)

Trimethylol propane triacrylate (manufactured by Sigma-Aldrich, abbreviation: TMPTA)

Dimethylol tricyclodecane diacrylate (manufactured by Kyoeisha Co., Ltd., abbreviation: DCPDA)

1,3-Adamantane dimethanol diacrylate (manufactured by Idemitsu Kosan Co., Ltd., abbreviation: ADDA)

Tetraethylene glycol diacrylate (manufactured by Osaka Organic Chemical Industry Ltd., trade name: V #335HP)

Isobornyl acrylate (manufactured by Kyoeisha Chemical Co., Ltd., trade name: IB-XA)

Benzyl acrylate (manufactured by Osaka Organic Chemical Industry Ltd., trade name: V #160)

Neopentyl glycol diacrylate (manufactured by Kyoeisha Chemical Co., Ltd., trade name: NP-A)

Irgacure 369 (manufactured by BASF, abbreviation: I.369)

Pentadecaethylene glycol mono-1H,1H,2H,2H-perfluorooctyl ether ($F(CF_2)_6CH_2CH_2(OCH_2CH_2)_{15}OH$) (manufactured by DIC Corporation, abbreviation: DEO-15)

A required time for each step at the time of the application of the [pattern forming method] of the present invention is shown in Table 2.

In each of Comparative Examples 1 and 2, a required time for each step when the laying step (2) to the releasing step (5) are sequentially performed for the each shot area by the related-art pattern method is shown.

TABLE 2

|  | Comparative Example 1 | Comparative Example 2 | Example 1 | Example 2 | Example 3 |
|---|---|---|---|---|---|
| Curable composition (A1) | (A1-1) | (A1-1) | (A1-1) | (A1-2) | (A1-3) |
| Curable composition (A2) | (A2-1) | (A2-1) | (A2-1) | (A2-1) | (A2-1) |
| Number of shot areas on which steps are continuously performed | 1 | 1 | 2 | 2 | 6 |
| Laying step (2) | 0.5 sec | 0.5 sec | 1.5 sec | 1.0 sec | 1.0 sec |
| Standby step (M) | 0 sec | 1.5 sec | 0 sec | 0 sec | 0 sec |
| Mold contacting step (3) Light irradiating step (4) Releasing step (5) | 1.5 sec | 1.5 sec | 1.5 sec | 1.0 sec | 1.0 sec |
| Mixing interval | 0 sec | 1.5 sec | 1.5 sec | 1.0 sec | 5.0 sec |
| One-shot cycle* (average) | 2.0 sec | 3.5 sec | 3.0 sec | 2.0 sec | 2.0 sec |

*One-shot cycle . . . The total of times required for the laying step (2) to the releasing step (5) per shot area In each of Examples 1 to 3, despite the fact that the required time for the standby step [M] is 0 seconds, a sufficient mixing interval can be secured, and as a result, the curable compositions (A1) and (A2) are sufficiently mixed. In each of Examples 2 and 3, a time required for a liquid droplet to spread after a mold has been brought into contact with the curable composition (A2) reduces, and hence the total required time for the steps (3) to (5) can be shortened to 1.0 second. In Comparative Example 1, the required time for the standby step (M) is 0 seconds and hence high throughput is obtained. However, the mixing interval is also 0 seconds, and hence the mixing of the curable compositions (A1) and (A2) is insufficient. In Comparative Example 2, a time of 1.5 seconds is secured for the standby step [M], and hence the curable compositions (A1) and (A2) are uniformly mixed. However, the one-shot cycle is as long as 3.5 seconds and hence throughput reduces.

It was shown from the foregoing that when the method of the present invention was used, a photo-nanoimprint pattern was able to be formed at high throughput and with uniform composition.

According to the present invention, it is possible to provide the pattern forming method that provides high throughput and has uniform physical properties in a shot area of a substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A pattern forming method using a photo-nanoimprint process, the method comprising performing, on each of a plurality of shot areas on a surface of a substrate, in this order:
    a laying step (1) of laying a layer formed of a curable composition (A1) containing at least a component (a1) serving as a polymerizable compound as a liquid film on the substrate;
    a dispensing step (2) of dispensing liquid droplets of a curable composition (A2) containing at least a component (a2) serving as a polymerizable compound dropwise discretely onto the liquid film of the layer formed of the curable composition (A1) to lay the liquid droplets;
    a mold contacting step (3) of sandwiching a layer obtained by partially mixing the curable composition (A1) and the curable composition (A2), the layer being formed by performing the dispensing step (2), between a mold and the substrate;
    a light irradiating step (4) of irradiating the layer obtained by partially mixing the curable composition (A1) and the curable composition (A2) with light from a side of the mold to cure the layer; and
    a releasing step (5) of releasing the mold from the layer formed of the curable composition (A1) and the curable composition (A2) after the curing,
    wherein when steps from the mold contacting step (3) to the releasing step (5) are collectively called an imprinting step [Im], in a time period from an end of the dispensing step (2) to a beginning of the imprinting step [Im] in at least one shot area selected from the plurality of shot areas, the dispensing step (2) or the imprinting step [Im] is performed on a shot area different from the selected at least one shot area.

2. The pattern forming method according to claim 1, wherein after the dispensing step (2) has been sequentially performed on a plurality of shot areas (S(1), S(2), . . . , S(n)), where n represents an integer of 2 or more, selected from the plurality of shot areas, the imprinting step [Im] is performed on the selected plurality of shot areas (S(1), S(2), . . . , S(n)) in the same order as that of the dispensing step (2).

3. The pattern forming method according to claim 1, wherein the dispensing step (2) on one shot area selected from the plurality of shot areas and the imprinting step [Im] on another shot area on which the dispensing step (2) has already been performed out of the plurality of shot areas are simultaneously performed.

4. The pattern forming method according to claim 3, wherein after the dispensing step (2) has been sequentially performed on a first plurality of shot areas (S(1), S(2), . . . , S(m)), where m represents an integer of 2 or more, selected from the plurality of shot areas, the dispensing step (2) on a second plurality of shot areas (S(m+1), S(m+2), . . . , S(2m)) selected from the plurality of shot areas, the second plurality of shot areas being identical in number to the first plurality of shot areas, and the imprinting step [Im] on the first plurality of shot areas (S(1), S(2), . . . , S(m)) are simultaneously and sequentially performed in a concurrent manner.

5. The pattern forming method according to claim 1, wherein after the dispensing step (2) has been sequentially performed on a first plurality of shot areas (S(1), S(2), . . . , S(m)), where m represents an integer of 2 or more, selected from the plurality of shot areas, the imprinting step [Im] on the shot area (S(1)) and the dispensing step (2) on a shot area (S(m+1)) are alternately performed, and hereafter similarly, the imprinting step [Im] on a shot area (S(p)), where p represents an integer of 2 or more, and the dispensing step (2) on a shot area (S(p+m)) are alternately performed.

6. The pattern forming method according to claim 5, wherein when the dispensing step is sequentially performed on the plurality of shot areas (S(1), S(2), . . . , S(m)), where m represents an integer of 2 or more, a standby time having the same length as that of a time required for performance of the imprinting step [Im] on one shot area is arranged in a time period from performance of the dispensing step (2) on one shot area to performance of the dispensing step (2) on a next shot area.

7. The pattern forming method according to claim 3, wherein the dispensing step (2) and the imprinting step [Im] are performed on a plurality of substrates with one dispenser and one imprint head, and simultaneously with the dispensing step (2) on one shot area on a first substrate, the imprinting step [Im] on one shot area on a second substrate is performed.

8. The pattern forming method according to claim 1, wherein a time Td required for the dispensing step (2) and a time Ti required for the imprinting step [Im] are equal to each other.

9. The pattern forming method according to claim 1, wherein a content of a photopolymerization initiator (b1) in the curable composition (A1) is 0 parts by weight or more and less than 0.1 part by weight with respect to 100 parts by weight of the polymerizable compound (a1).

10. The pattern forming method according to claim 1, wherein a surface tension of the curable composition (A1) except a solvent is larger than a surface tension of the curable composition (A2) except a solvent.

11. The pattern forming method according to claim 1, wherein the curable composition (A1) except a solvent has a viscosity at 25° C. of 20 mPa·s or more and less than 10,000 mPa·s, and the curable composition (A2) has a viscosity at 25° C. of 1 mPa·s or more and less than 40 mPa·s.

12. A manufacturing method of a semiconductor integrated circuit comprising the pattern forming method of claim 1.

13. A manufacturing method of a quartz mold replica comprising the pattern forming method of claim 1.

14. A pattern forming method, comprising:
dispensing a droplet of an imprint resist discretely onto a liquid film of an imprint pretreatment coating on a substrate such that the droplet spreads on the liquid film of the imprint pretreatment coating to yield a spread imprint resist, wherein the imprint pretreatment coating comprises a polymerizable compound and the imprint resist is a polymerizable composition;
contacting the spread imprint resist with a mold;
irradiating the spread imprint resist and the imprint pretreatment coating with light to yield a cured layer on the substrate; and
releasing the mold from the cured layer,
wherein when steps from the contacting the spread imprint resist with a mold to the releasing the mold on each of a plurality of shot areas are collectively called an imprinting step [Im],
in a time period from an end of the dispensing to a beginning of the imprinting step [Im] in at least one shot area selected from the plurality of the shot areas, the dispensing or the imprinting step [Im] is performed on a shot area different from the selected at least one shot area.

15. A method for manufacturing a semiconductor device, the method comprising:
providing a liquid film of an imprint pretreatment coating on a substrate, wherein the imprint pretreatment coating comprises a polymerizable compound;
dispensing a droplet of an imprint resist onto the liquid film of the imprint pretreatment coating such that the droplet spreads on the liquid film of the imprint pretreatment coating to yield a spread imprint resist, wherein the imprint resist is a polymerizable composition;
contacting the spread imprint resist with a mold;
irradiating the spread imprint resist and the imprint pretreatment coating with light to yield a cured layer;
separating the mold from the cured layer; and
etching the substrate via the cured layer,
wherein when steps from the contacting the spread imprint resist with a mold to the releasing the mold on each of a plurality of shot areas are collectively called an imprinting step [Im],
in a time period from an end of the dispensing to a beginning of the imprinting step [Im] in at least one shot area selected from the plurality of the shot areas, the dispensing or the imprinting step [Im] is performed on a shot area different from the selected at least one shot area.

16. The method according to claim 15, wherein:
the providing of the liquid film of the imprinting pretreatment coating comprises coating the substrate using an inkjet method, dip coating, air knife coating, curtain coating, wire bar coating, gravure coating, extrusion coating, spin coating, or a slit scan method; and
the dispensing of the droplet of the imprint resist onto the liquid film of the imprinting pretreatment coating is performed using an ink jet method.

* * * * *